United States Patent
Hung et al.

(10) Patent No.: US 8,855,588 B2
(45) Date of Patent: Oct. 7, 2014

(54) POWER AMPLIFYING APPARATUS AND WIRELESS SIGNAL TRANSMITTER UTILIZING THE SAME

(71) Applicant: MStar Semiconductor, Inc., Hsinchu County (TW)

(72) Inventors: Chih-Ming Hung, Mckinney, TX (US); Zhong-Xuan Zhang, Hsinchu County (TW); Sheng-Che Tseng, Hsinchu County (TW)

(73) Assignee: MStar Semiconductor, Inc., Hsinchu County (TW)

( * ) Notice: Subject to any disclaimer, the term of this patent is extended or adjusted under 35 U.S.C. 154(b) by 2 days.

(21) Appl. No.: 13/719,487

(22) Filed: Dec. 19, 2012

(65) Prior Publication Data

US 2014/0170997 A1    Jun. 19, 2014

(51) Int. Cl.
  *H01Q 11/12*    (2006.01)
  *H04B 1/04*    (2006.01)
  *H03F 1/00*    (2006.01)

(52) U.S. Cl.
  CPC ... *H04B 1/04* (2013.01); *H03F 1/00* (2013.01)
  USPC .................. 455/127.2; 455/114.2; 455/127.1; 455/343.1

(58) Field of Classification Search
  CPC ................ H03F 1/0227; H03F 1/0238; H03F 2200/294; H03F 2200/372; H03F 1/3247; H03F 1/3294; H03F 1/00; H03F 1/3258; H03F 2200/336; H03F 3/189; H03F 3/24; H04L 27/368
  USPC ...................................... 455/127.2
  See application file for complete search history.

(56) References Cited

U.S. PATENT DOCUMENTS

2006/0128325 A1* 6/2006 Levesque et al. ......... 455/127.1
2011/0255636 A1* 10/2011 Ashita et al. .................. 375/297
2011/0261976 A1* 10/2011 Lu ................................. 381/94.5

* cited by examiner

*Primary Examiner* — Ajibola Akinyemi
(74) *Attorney, Agent, or Firm* — WPAT, PC; Justin King

(57) ABSTRACT

A power amplifying apparatus is provided. A reference signal generator provides a reference signal having an enabling state and a disabling state. A digital power amplifier generates a current based on the reference signal and an input signal. An output signal of the digital power amplifier is related to the current. When the reference signal is in the enabling state, the current is related to the input signal. When the reference signal is in the disabling state, the current is irrelevant to the input signal. During the enabling state of the reference signal, a data generator provides an output alternating between an in-phase signal and a quadrature-phase signal as the input signal to the digital power amplifier. When the reference signal is in the disabling state, the data generator provides a fixed signal as the input signal to the digital power amplifier.

12 Claims, 9 Drawing Sheets

POWER AMPLIFYING APPARATUS AND WIRELESS SIGNAL TRANSMITTER UTILIZING THE SAME

BACKGROUND OF THE INVENTION

1. Field of the Invention

The present invention relates to techniques for processing digital signals. In particular, the present invention relates to techniques for saving power in digital signal processing.

2. Description of the Related Art

With the advancements in electrical techniques, mobile electronic devices such as laptops and smart phones are widely developed and available. In order to enhance the mobility of such devices, it is critical for those mobile electronic device manufactures to seek ways to decrease both active and standby power consumption while having richer and diversified functions. Furthermore, as public environmental awareness has been raised in recent years, both stationary and mobile electronic devices are expected to have lower power consumption and higher energy utilization efficiency.

In a wireless communication device, the transceiver is usually the hardware component consuming the most power. FIG. 1(A) illustrates one part of a transmitter for digital quadrature modulation (DQM). According to the selection signal, the multiplexer 10 passes the in-phase signal I or the quadrature-phase signal Q to the digital power amplifier 100. Based on the signal marked as "M" at output of the multiplexer 10, the digital logic circuit 12 generates a plurality of signals to control the AND gates 14. When the clock signal in FIG. 1(A) has a high voltage level or is in an enabling state, the AND gates 14 will pass the output signals from the digital logic circuit 12 to the digital-to-analog converting units 16. On the contrary, when the clock signal has a low voltage level or is in a disabling state, the outputs of all the AND gates 14 will remain at a low voltage level regardless of the signals coming from the digital logic circuit 12.

FIG. 1(B) illustrates a conceptual diagram of one type of digital-to-analog converting unit 16. The switch 16B is controlled by the output signal of the AND gate 14 and is assumed to be an ideal switch where off-state impedance is infinity and there is no parasitic capacitance. When the output of the AND gate 14 has a high voltage level, the switch 16B is turned on, so as to provide a current I flowing through the loading 16A. When the output of the AND gate 14 has a low voltage level, the switch 16B is turned off thereby shutting off the current I. It can be seen that the output signal of the AND gate 14 influences the current I flowing through the loading 16A. Furthermore, the amount of current I flowing through the loading 16A influences the output signal of the digital power amplifier 100.

FIG. 1(C) shows a timing diagram of the aforementioned clock signal, selection signal, and data signal M. The clock signal and selection signal are both square signals with 50% duty cycle. The frequency of the selection signal is twice the frequency of the clock signal. When the selection signal has a high voltage level, the multiplexer 10 outputs the in-phase signal I to the digital power amplifier 100. When the selection signal has a low voltage level, the multiplexer 10 outputs the quadrature-phase signal Q to the digital power amplifier 100. It can be seen from FIG. 1(A) and FIG. 1(C) that during the time period marked as "T", regardless of the voltage level of signal M, the outputs of the AND gates 14 are all zero. However, the toggling of the selection signal in duration T still leads to signal level changes in the signal M. Hence, even though the output signal of the digital power amplifier 100 is not driven by the signal M in duration T, the digital logic circuit 12 still has activities due to the non-static signal M resulting in unnecessary power consumption. The loading 16A may have capabilities of energy storage and energy dissipation. As a result, the kinetic energy circulation within loading 16A may still be related to signal M during duration T although there is no current I flowing through the switch 16B.

SUMMARY OF THE INVENTION

To solve the aforementioned problem, the invention provides new power amplifying apparatuses and wireless signal transmitters. By preventing the digital logic circuit in a digital power amplifier from having unnecessary switching, the overall power consumption of a power amplifying apparatus can be reduced.

One embodiment according to the invention is a power amplifying apparatus including a reference signal generator, a digital power amplifier, and a data generator. The reference signal generator provides a reference signal alternating between an enabling state and a disabling state. Based on the reference signal and an input signal, the digital power amplifier generates a current. An output signal of the digital power amplifier is related to the current. When the reference signal is in the enabling state, the current is related to the input signal. When the reference signal is in the disabling state, the current is irrelevant to the input signal. During enabling state of the reference signal, the data generator provides a signal alternating between an in-phase signal and a quadrature-phase signal as the input signal to the digital power amplifier. When the reference signal is in the disabling state, the data generator provides a static signal as the input signal to the digital power amplifier.

Another embodiment according to the invention is a wireless signal transmitter including an RF signal generator, a digital power amplifier, an antenna, and a data generator. The RF signal generator provides an RF signal alternating between an enabling state and a disabling state. Based on the RF signal and an input signal, the digital power amplifier generates a current. An output signal of the digital power amplifier is related to the current. When the RF signal is in the enabling state, the current is related to the input signal. When the RF signal is in the disabling state, the current is irrelevant to the input signal. The antenna is used for radiating the output signal of the digital power amplifier. During enabling state of the RF signal, the data generator provides a signal alternating between an in-phase signal and a quadrature-phase signal to the digital power amplifier. When the RF signal is in the disabling state, the data generator provides a fixed signal to the digital power amplifier.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 2A:
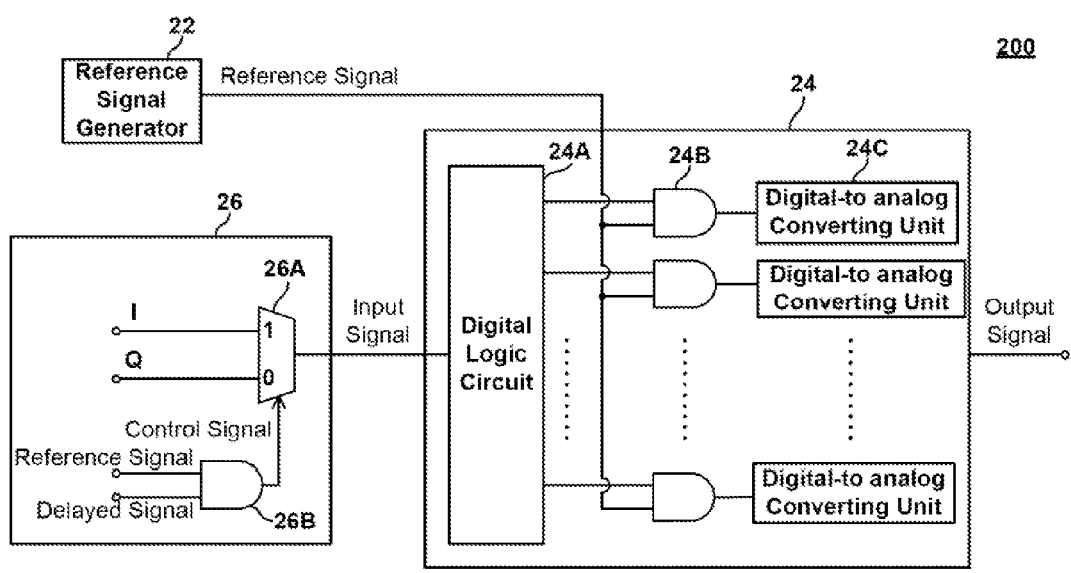
FIG. 2(A) shows a block diagram of the power amplifying apparatus in one embodiment according to the invention.

One embodiment according to the invention is the power amplifying apparatus shown in FIG. 2(A). The power amplifying apparatus 200 includes a reference signal generator 22, a digital power amplifier 24, and a data generator 26. In actual applications, the power amplifying apparatus 200 can be integrated in various electronic devices requiring a power amplifying function.

The reference signal generator 22 provides a reference signal alternating between an enabling state and a disabling state. In the following descriptions, the reference signal is assumed to be a clock signal with 50% duty cycle. In addition, the reference signal is assumed to be in an enabling state when having a high voltage level and in a disabling state when having a low voltage level.

Based on the reference signal provided by the reference signal generator 22 and an input signal provided by the data generator 26, the digital power amplifier 24 generates an output signal. As shown in FIG. 2(A), the digital power amplifier 24 includes a digital logic circuit 24A, a plurality of AND gates 24B, and a plurality of digital-to-analog converting units 24C. The output of the data generator 26 is processed by the digital logic circuit 24A and is converted to signals controlling the AND gates 24B. When the reference signal has a high voltage level, the outputs of the digital logic circuit 24A are passed through the AND gates 24B to the digital-to-analog converting units 24C. On the contrary, when the reference signal has a low voltage level, regardless of the voltage levels of the outputs from the digital logic circuit 24A, all AND gates 24B output remain at low voltage level.

Figure 1A:
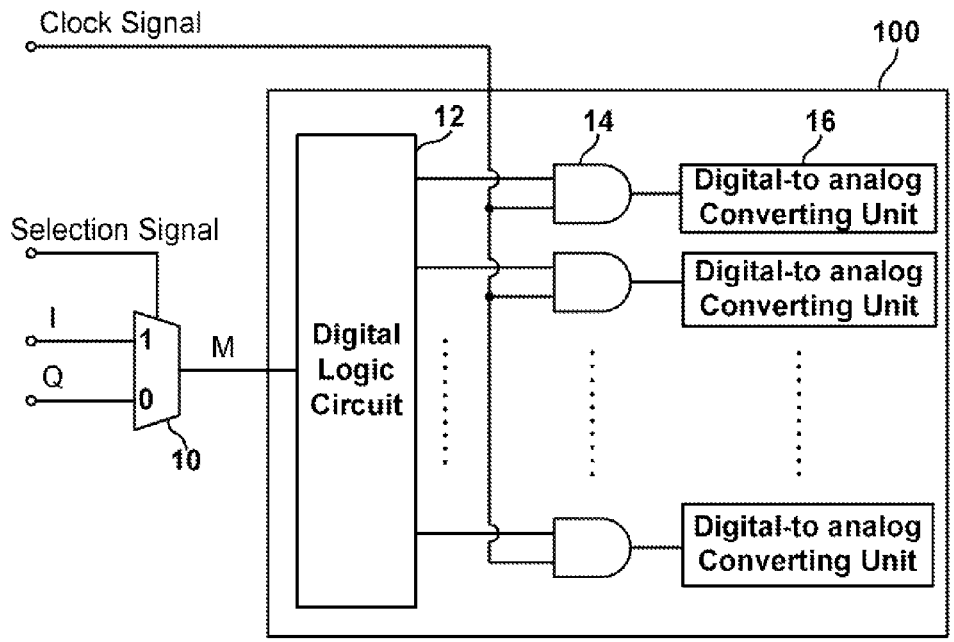
FIG. 1(A) illustrates one part of a prior art transmitter for digital quadrature modulation.
Figure 1B:
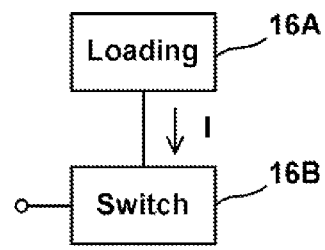
FIG. 1(B) illustrates a conceptual diagram of one such prior art digital-to-analog converting unit.
Figure 1C:
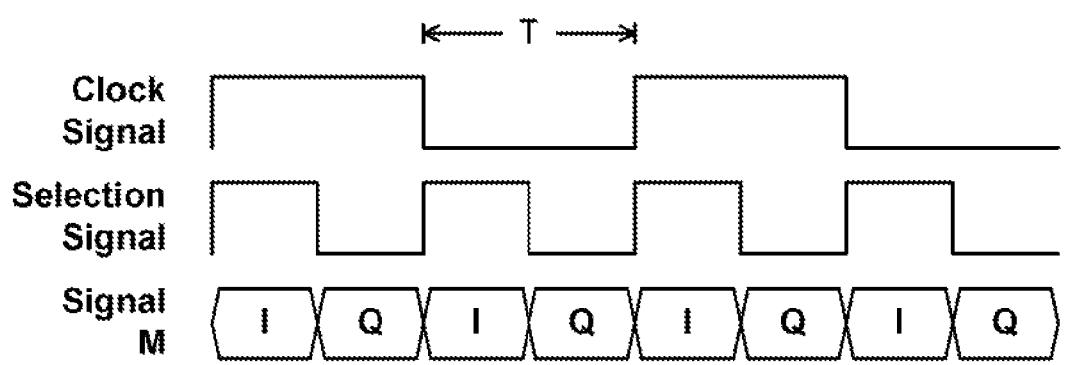
FIG. 1(C) shows a corresponding timing diagram of the prior art.

Digital-to-analog converting unit 24C performs a similar function to the aforementioned digital-to-analog converting unit 16 shown in FIG. 1(B). Note that the implementation of the digital-to-analog converting unit 24C is not limited to any specific circuit topology. The output signal of the digital power amplifier 24 is related to the currents in the digital-to-analog converting units 24C. Therefore, when the reference signal is in the enabling state, the output signal of the digital power amplifier 24 will change according to the input signal. On the contrary, when the reference signal is in the disabling state, the output signal of the digital power amplifier 24 is not driven by the input signal feeding into the digital power amplifier 24.

Figure 2B:
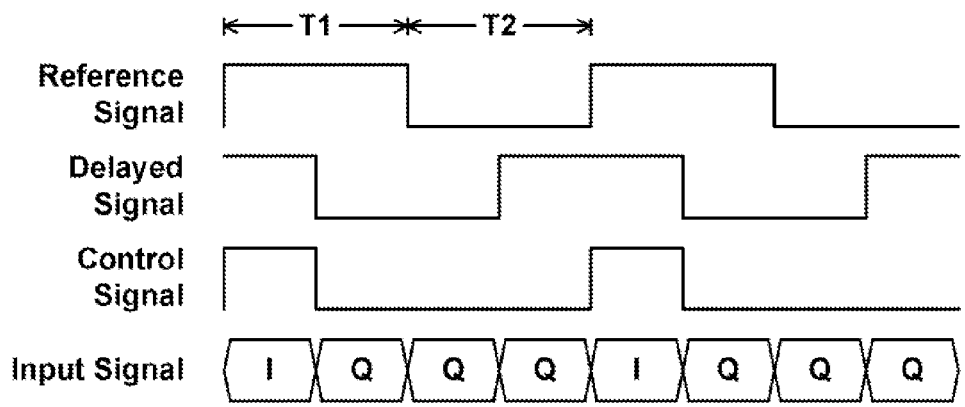
FIG. 2(B) shows a corresponding timing diagram according to the invention.

The data generator 26 includes a multiplexer 26A and a controller formed by the AND gate 26B. There are two inputs to the AND gate 26B. The first one is the reference signal provided by the reference signal generator 22 and the second one is a delayed version of the reference signal. The timing relation is shown in FIG. 2(B). The multiplexer 26A is controlled by the output of the AND gate 26B to send out either an in-phase signal I or a quadrature-phase signal Q. As depicted in FIG. 2(B), during the first half of T1 (i.e. when the reference signal is in the enabling state), the in-phase signal I is selected by the control signal and is passed to the digital power amplifier 24 while during the second half of T1, the quadrature-phase signal Q is selected and is fed to the digital power amplifier 24. On the other hand, during T2 (i.e. when the reference signal is in the disabling state), the control signal remains static and the quadrature-phase signal Q is passed through the multiplexer 26A.

As described above, when the reference signal is in the disabling state, the data generator 26 statically provides the quadrature-phase signal Q as the input signal to the digital power amplifier 24. In typical applications, relative to the reference signal, the in-phase signal I and quadrature-phase signal Q are both low-speed signals. Hence, the input signal feeding to the digital logic circuit 24A generally does not have any voltage level change during T2. Because the digital logic circuit 24A does not have to perform logic switching during T2, unnecessary power consumption can be eliminated. In comparison with prior arts, the overall power consumption of the digital power amplifier 24 is obviously lower.

Figure 2C:
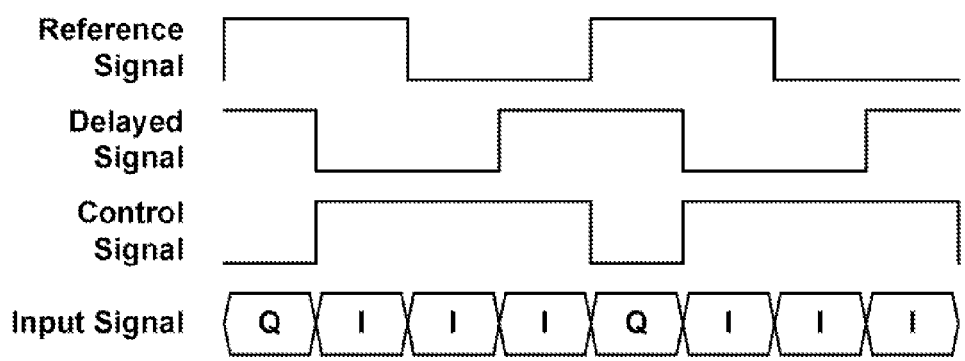
FIG. 2(C) and FIG. 2(D) show timing diagrams of power amplifying apparatuses according to the invention.

In another embodiment, the AND gate 26B in FIG. 2(A) is replaced by a NAND gate. The corresponding control signal and input signal are shown in FIG. 2(C). In this condition, when the reference signal is in the disabling state, the data generator 26 statically provides the in-phase signal I as the input signal to the digital power amplifier 24. This embodiment can also achieve the goal of reducing power consumption of the digital logic circuit 24A.

Figure 2D:
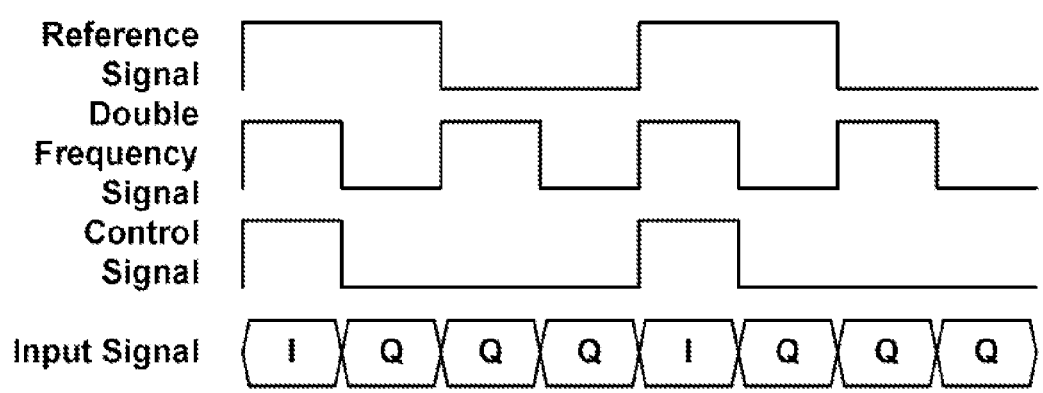

In yet another embodiment, the delayed signal in FIG. 2(A) is replaced by a signal operating at twice frequency of the reference signal. The corresponding control signal and input signal are shown in FIG. 2(D). In this condition, when the reference signal is in the disabling state, the data generator 26 statically provides the quadrature-phase signal Q as the input signal to the digital power amplifier 24. This embodiment can also achieve the goal of reducing power consumption of the digital logic circuit 24A.

Figure 3A:
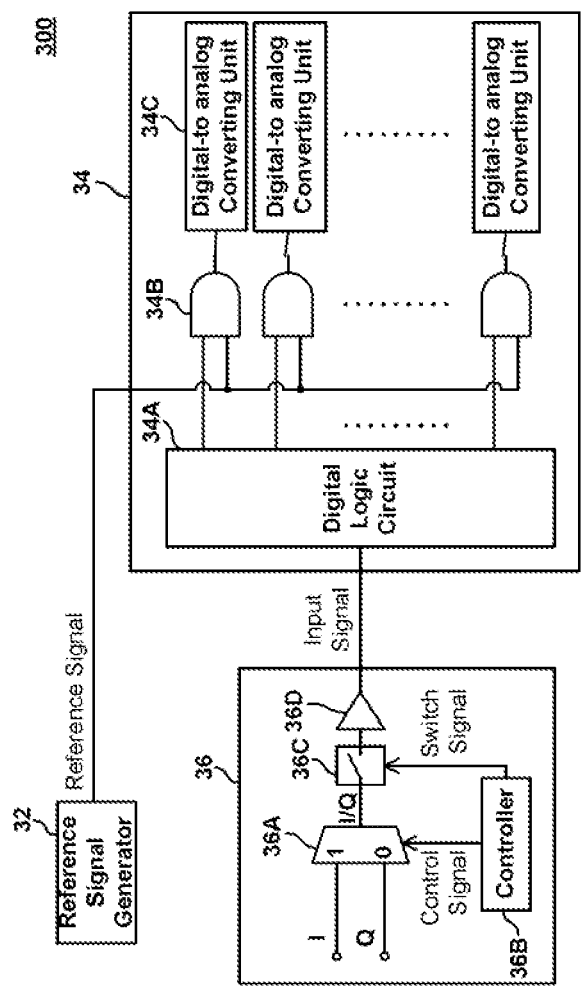
FIG. 3(A) illustrates a block diagram of the power amplifying apparatus in one embodiment according to the invention.
Figure 3B:
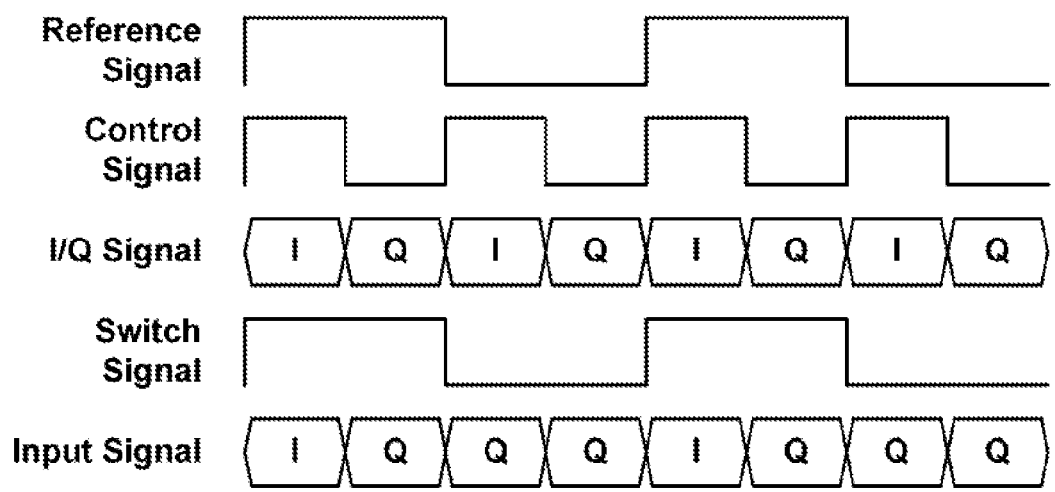
FIG. 3(B) shows a corresponding timing diagram according to the invention.

Another embodiment according to the invention is the power amplifying apparatus 300 shown in FIG. 3(A), and its timing diagram is shown in FIG. 3(B). The data generator 36 includes a multiplexer 36A, a controller 36B, a switch 36C, and a buffer 36D. The digital power amplifier 34 includes a digital logic circuit 34A, a plurality of AND gates 34B, and a plurality of digital-to-analog converting units 34C. The operations of these blocks are explained in the descriptions related to the digital power amplifier 24. The switch 36C and the buffer 36D are connected in series between the multiplexer 36A and the digital power amplifier 34. The controller 36B is responsible for providing a control signal to the multiplexer 36A and a switch signal to the switch 36C.

As shown in FIG. 3(A), the reference signal generated by the reference signal generator 32 can be used as the switch signal for the switch 36C. When the reference signal is in the enabling state, the switch 36C is turned on, and the buffer 36D relays the output signal of the multiplexer 36A to the digital power amplifier 34. When the reference signal is in the disabling state, the switch 36C is turned off. The buffer 36D temporarily holds the output signal of the multiplexer 36A before the switch 36C is turned off thus the input signal going to the digital power amplifier 34 is kept constant. In this embodiment, before the switch 36C is turned off, the output signals of the multiplexer 36A are the in-phase signal I or the quadrature-phase signal Q. Hence, when the reference signal is in the disabling state, the buffer 36D statically provides the quadrature-phase signal Q as the input signal. This embodiment can obviously achieve the goal of reducing power consumption of the digital logic circuit 34A.

Figure 4A:
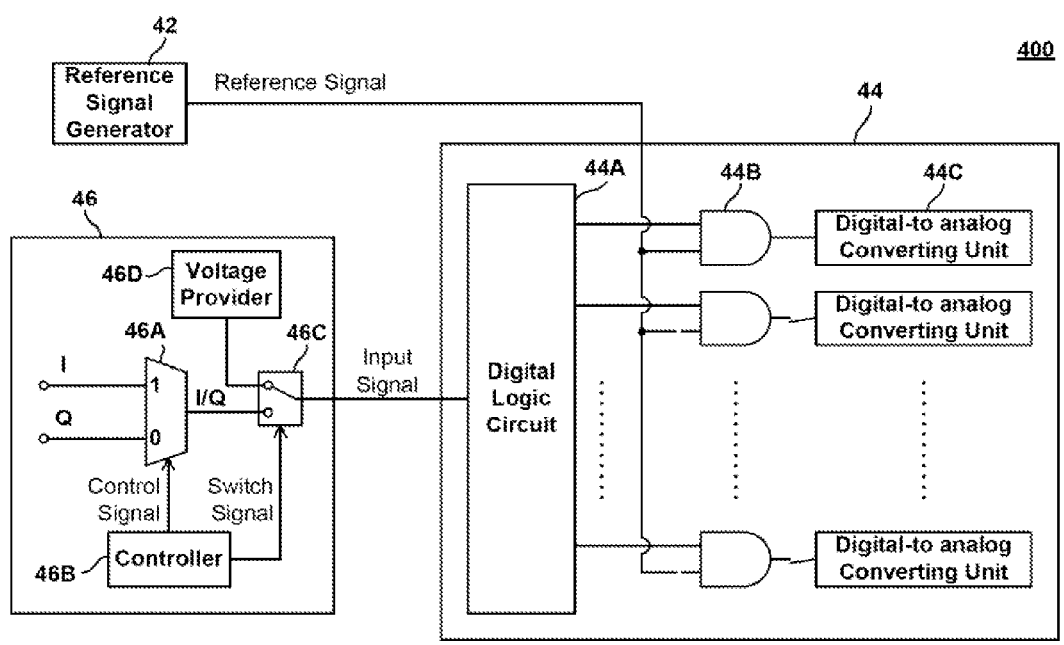
FIG. 4(A) illustrates a block diagram of the power amplifying apparatus in one embodiment according to the invention.
Figure 4B:
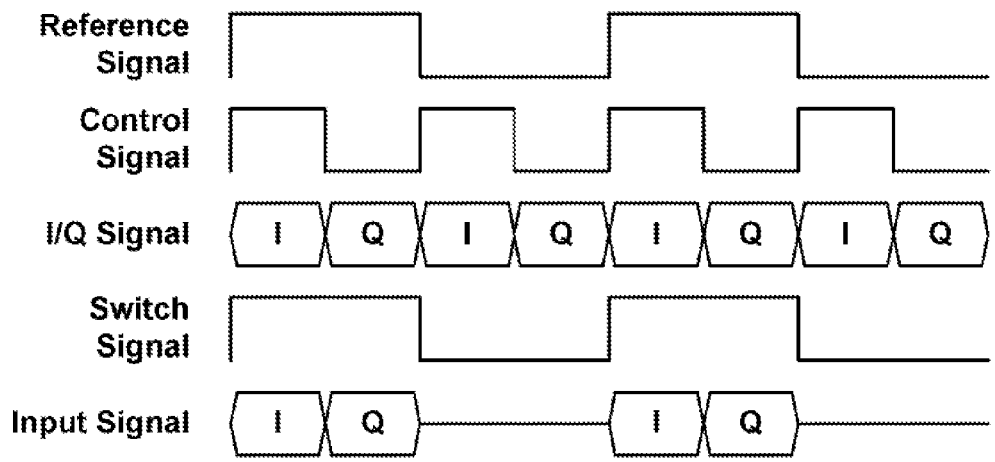
FIG. 4(B) shows a corresponding timing diagram according to the invention.

Another embodiment according to the invention is the power amplifying apparatus 400 shown in FIG. 4(A), and its timing diagram is shown in FIG. 4(B). The data generator 46 includes a multiplexer 46A, a controller 46B, a switch 46C, and a voltage provider 46D. The digital power amplifier 44 includes a digital logic circuit 44A, a plurality of AND gates 44B, and a plurality of digital-to-analog converting units 44C. The operations of these blocks are explained in the descriptions related to the digital power amplifier 24. When the reference signal is in the enabling state, the switch 46C relays the output signal of the multiplexer 46A to the digital power amplifier 44. When the reference signal is in the disabling state, the switch 46C passes a static voltage generated by the voltage provider 46D to the digital power amplifier 44. In practice, the static voltage can be, but not limited to, at a ground voltage or at a power supply voltage. Since the static voltage can prevent the digital logic circuit 44A from performing logic switching, the goal of reducing power consumption of the digital logic circuit 44A can be achieved.

In the aforementioned embodiments, when the reference signal is in the enabling state, output of the data generator alternates between the in-phase signal and the quadrature-phase signal and is fed to the digital power amplifier. On the contrary, when the reference signal is in the disabling state, the data generator sends out a fixed voltage signal to the digital power amplifier. Note that the duty cycles of the signals and the definitions of enabling states and disabling states for the reference signal are not limited to the assumptions in the aforementioned embodiments. For instance, the duty cycle of the control signal in FIG. 2(B) is not limited to 25%.

Figure 5:
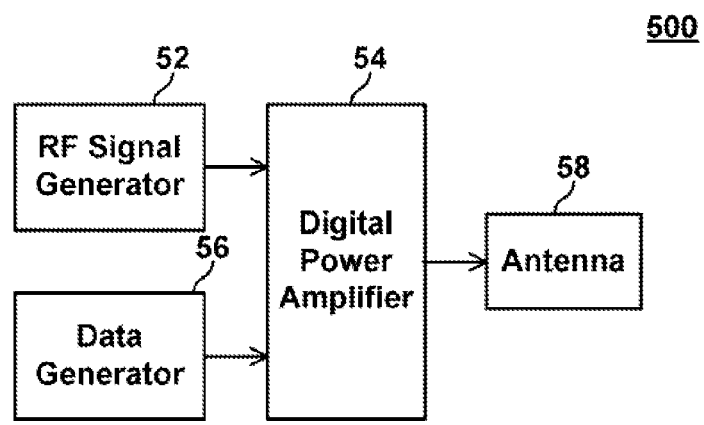
FIG. 5 shows a block diagram of the wireless signal transmitter in one embodiment according to the invention.

Another embodiment according to the invention is the wireless signal transmitter 500 shown in FIG. 5. This wireless signal transmitter includes an RF signal generator 52, a digital power amplifier 54, a data generator 56, and an antenna 58. The RF signal generator 52 is used for providing an RF signal alternating between an enabling state and a disabling state. Based on the RF signal and an input signal, the digital power amplifier 54 generates a current. An output signal of the digital power amplifier is related to the current. When the RF signal is in the enabling state, the current is related to the input signal. When the RF signal is in the disabling state, the current is irrelevant to the input signal. During enabling state of the RF signal, the data generator provides a signal alternating between an in-phase signal and a quadrature-phase signal, and feeds to the digital power amplifier. When the RF signal is in the disabling state, the data generator provides a fixed signal to the digital power amplifier. The antenna 58 is used for radiating the output signal of the digital power amplifier 54.

The detailed operations of the blocks in the wireless signal transmitter 500 can be found in the previous paragraphs related to the power amplifying apparatuses 200, 300, and 400. Besides, various changes that can be made to the power amplifying apparatuses 200, 300, and 400 are applicable to the wireless signal transmitter 500. The details are not further described for the sake of brevity.

As described above, the invention provides new power amplifying apparatuses and wireless signal transmitters. By preventing the digital logic circuit in a digital power amplifier from unnecessary switching, the overall power consumption of a power amplifying apparatus can be significantly reduced.

Although the present invention has been described in detail with examples and explanations above, those skilled in the art will readily observe that numerous modifications and alterations of the device may be made without departing from the teaching of the invention in its broadest form. Accordingly, the present invention is intended to embrace all such alterations, modifications, and variations that fall within the spirit and scope of the appended claims.

What is claimed is:

1. A power amplifying apparatus, comprising:
   a reference signal generator for providing a reference signal alternating between an enabling state and a disabling state;
   a digital power amplifier generating an internal current based on the reference signal and a data generator signal, and generating an output signal related to the internal current, wherein when the reference signal is in the enabling state, the output signal is related to the data generator signal, when the reference signal is in the disabling state, the output signal is irrelevant to the data generator signal; and
   a data generator generating the data generator signal and outputting the data generator signal to the digital power amplifier, comprising:
      a multiplexer, wherein the multiplexer outputs the data generator signal; and
      a controller, wherein the controller comprises an AND gate, the AND gate receives the reference signal and a delayed signal, the delayed signal is generated by delaying the reference signal, and the AND gate outputs a control signal;
   wherein when the reference signal is in the enabling state, the data generator signal is alternating between an in-phase signal and a quadrature-phase signal, when the reference signal is in the disabling state, the data generator signal is a fixed signal; and
   wherein the multiplexer receives the in-phase signal and the quadrature-phase signal, and the controller generates the control signal based on the reference signal for controlling the multiplexer to select the in-phase signal or the quadrature-phase signal for outputting.

2. The power amplifying apparatus of claim 1, wherein the fixed signal is the in-phase signal, the quadrature-phase signal, or a static voltage signal.

3. The power amplifying apparatus of claim 1, wherein the controller comprises an AND gate, the AND gate receives the reference signal and a double frequency signal, the double frequency signal is generated by doubling a frequency of the reference signal, and the AND gate outputs the control signal.

4. The power amplifying apparatus of claim 1, wherein the data generator further comprises a switch and a buffer connected in series between the multiplexer and the digital power amplifier, when the reference signal is in the enabling state, the switch is turned on, and the buffer relays the multiplexer's output to the digital power amplifier, when the reference signal is in the disabling state, the switch is turned off, the buffer temporarily holds the multiplexer's output before the switch is turned off, and the buffer provides a held signal to the digital power amplifier.

5. The power amplifying apparatus of claim 4, wherein the buffer is a latch.

6. The power amplifying apparatus of claim 1, wherein the data generator further comprises a switch and a voltage provider, and the voltage provider generates a static voltage, wherein when the reference signal is in the enabling state, the switch passes the multiplexer's output to the digital power amplifier, when the reference signal is in the disabling state, the switch couples the static voltage to the digital power amplifier, so that the static voltage is supplied as the data generator signal to the digital power amplifier.

7. A wireless signal transmitter, comprising:
an RF signal generator for providing an RF signal alternating between an enabling state and a disabling state;
a digital power amplifier generating a current based on the RF signal and a data generator signal, and generating an output signal related to the current, wherein when the RF signal is in the enabling state, the output signal is related to the data generator signal, and when the RF signal is in the disabling state, the output signal is irrelevant to the data generator signal;
an antenna for radiating the output signal of the digital power amplifier; and
a data generator generating the data generator signal and outputting the data generator signal to the digital amplifier, comprising:
  a multiplexer, wherein the multiplexer outputs the data generator signal to the digital power amplifier; and
  a controller, wherein the controller comprises an AND gate, the AND gate receives the RF signal and a delayed signal, the delayed signal is generated by delaying the RF signal, and the AND gate outputs a control signal;
wherein when the RF signal is in the enabling state, the data generator signal is alternating between an in-phase signal and a quadrature-phase signal, and when the RF signal is in the disabling state, the data generator signal is a fixed signal; and
wherein the multiplexer receives the in-phase signal and the quadrature-phase signal; the controller generates the control signal based on the RF signal for controlling the multiplexer to select the in-phase signal or the quadrature-phase signal for outputting.

8. The wireless signal transmitter of claim 7, wherein the fixed signal is the in-phase signal, the quadrature-phase signal, or a static voltage signal.

9. The wireless signal transmitter of claim 7, wherein the controller comprises an AND gate, the AND gate receives the RF signal and a double frequency signal, the double frequency signal is generated by doubling a frequency of the RF signal, and the AND gate outputs the control signal.

10. The wireless signal transmitter of claim 7, wherein the data generator further comprises a switch and a buffer connected in series between the multiplexer and the digital power amplifier, wherein when the RF signal is in the enabling state, the switch is turned on, and the buffer relays the multiplexer's output to the digital power amplifier; and when the RF signal is in the disabling state, the switch is turned off, the buffer temporarily holds the multiplexer's output before the switch is turned off, and the buffer provides a held signal to the digital power amplifier.

11. The wireless signal transmitter of claim 10, wherein the buffer is a latch.

12. The wireless signal transmitter of claim 7, wherein the data generator further comprises a switch and a voltage provider, and the voltage provider generates a static voltage, wherein when the RF signal is in the enabling state, the switch is set as passing the multiplexer's output to the digital power amplifier; and when the RF signal is in the disabling state, the switch is couples the static voltage to the digital power amplifier, so that the static voltage is supplied to the digital power amplifier.

* * * * *